(12) United States Patent
Brazeau et al.

(10) Patent No.: US 12,184,192 B2
(45) Date of Patent: Dec. 31, 2024

(54) SYSTEMS FOR THERMAL MANAGEMENT OF A VEHICLE

(71) Applicant: DANA TM4 INC., Boucherville (CA)

(72) Inventors: Michel Brazeau, Delson (CA); Michel Tulane, Saint-Hubert (CA); Pascal Fleury, Sainte-Madeleine (CA); Alexandre Marquis, Boucherville (CA); Francois Dube, Montreal (CA); Maxime Caron, Montreal (CA); Maalainine El Yacoubi, Sainte Julie (CA); Martin Houle, Laval (CA)

(73) Assignee: DANA TM4 INC., Boucherville (CA)

( * ) Notice: Subject to any disclaimer, the term of this patent is extended or adjusted under 35 U.S.C. 154(b) by 238 days.

(21) Appl. No.: 18/056,622

(22) Filed: Nov. 17, 2022

(65) Prior Publication Data

US 2024/0171084 A1    May 23, 2024

(51) Int. Cl.
*H05K 7/20* (2006.01)
*H02M 7/00* (2006.01)
*H05K 1/14* (2006.01)

(52) U.S. Cl.
CPC ............ *H02M 7/003* (2013.01); *H05K 1/144* (2013.01); *H05K 7/20927* (2013.01)

(58) Field of Classification Search
CPC .... H02M 7/003; H02M 1/44; H05K 7/20927; H05K 1/144; H05K 2201/042; H05K 7/20409; H05K 1/0201; H05K 1/0204; H05K 1/09; H05K 7/2039; H05K 7/20445; H05K 7/20518; H05K 9/0022; H01L 23/473; G06F 1/20; G06F 1/181
USPC ........................................................ 361/699
See application file for complete search history.

(56) References Cited

U.S. PATENT DOCUMENTS

| | | | | |
|---|---|---|---|---|
| 4,557,225 | A * | 12/1985 | Sagues | F02D 41/3005 123/41.31 |
| 6,509,629 | B2 * | 1/2003 | Yoshimatsu | H01L 23/552 257/691 |
| 2011/0261588 | A1 * | 10/2011 | Hattori | H02K 11/33 363/13 |
| 2014/0118950 | A1 | 5/2014 | Wieland et al. | |
| 2015/0003015 | A1 | 1/2015 | Kulkarni et al. | |
| 2017/0005581 | A1 * | 1/2017 | Fukumasu | H02M 3/28 |
| 2018/0042137 | A1 * | 2/2018 | Reeves | H05K 7/20254 |
| 2020/0006197 | A1 | 1/2020 | Hart et al. | |
| 2024/0213156 | A1 * | 6/2024 | Darmawikarta | H01L 23/53209 |

FOREIGN PATENT DOCUMENTS

GB    2602340 A    6/2022

* cited by examiner

*Primary Examiner* — Mandeep S Buttar
(74) *Attorney, Agent, or Firm* — McCoy Russell LLP

(57) ABSTRACT

Systems are provided for a cooling system for an electric vehicle. In one example, a system includes a plate arranged between separate circuit boards. The plate directly cools one of the circuit boards and block thermal communication between the circuit boards.

18 Claims, 3 Drawing Sheets

SYSTEMS FOR THERMAL MANAGEMENT OF A VEHICLE

TECHNICAL FIELD

The present description relates generally to a cooling system of an inverter of a vehicle.

BACKGROUND AND SUMMARY

Vehicles may include a plurality of components that demand cooling for optimal efficiency. For example, power control systems may demand cooling along with auxiliary components thereof. Customers continue to demand increased vehicle range and storage space. To meet these demands, manufacturers may decrease a packaging space of various components. However, decreasing the packaging space may result in waste heat from hotter components flowing to other components. This may result in demands to change a cooling system arrangement.

For example, reducing an inverter size may decrease its weight and cost while increasing its longevity. However, the inverter may face the same thermal challenges described above. Natural convection cooling and isolation between hotter and cooler components may be desired to maintain inverter efficiency and component longevity.

In one example, the issues described above may be at least partially solved by a system for an inverter comprising a plate arranged between a power board and a control board, wherein the plate comprises a plurality of tabs for mounting the plate and the power board to a base. By doing this, a size of the inverter may be reduced while thermal separation between a plurality of gate resistors and the control board is maintained.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE FIGURES

The above, as well as other advantages of the present disclosure, will become readily apparent to those skilled in the art from the following detailed description when considered in light of the accompanying drawings in which.

DETAILED DESCRIPTION

Figure 1:
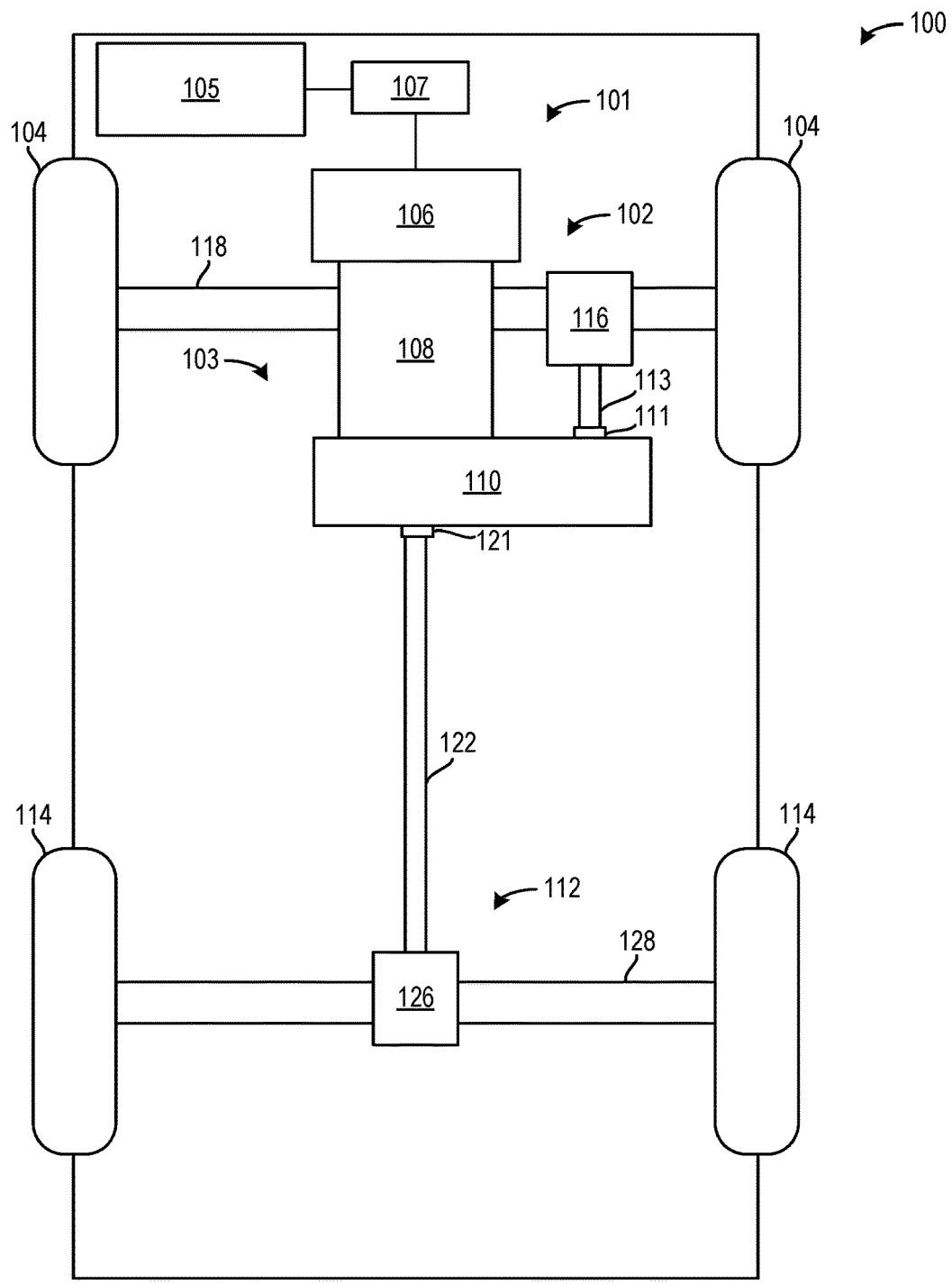
FIG. 1 is a schematic depiction of an example vehicle powertrain, according to an embodiment of the present disclosure.

The following description relates a cooling system of a vehicle. In one example, the vehicle comprises an electric drive unit comprising an inverter, electric motor, gearbox, and the like, as shown in FIG. 1. A control board of the inverter, illustrated in FIG. 2, may include a cooling plate, shown in FIGS. 3A and 3B.

In one example, the disclosure provides support for an inverter including a power board and a control board. Each of the power board and the control board may be printed circuit boards (PCBs). The power board may include a plurality of gate resistors, a power module, and gate driver boards. The control board may include a controller for controlling actions of the power board. The plurality of gate resistors may generate heat. A plate is arranged between the power board and the control board to reduce thermal transfer from the power board to the control board.

The plate may include a plurality of tabs. The plurality of tabs may extend into a coolant jacket. Coolant in the coolant jacket may cool the plurality of tabs, which may cool the plate. In one example, the plate is in contact with the plurality of gate resistors, such that the plate actively cools the power board. By doing this, a space between the power board and the plurality of gate resistors may be reduced.

In some examples, additionally or alternatively, the plurality of tabs may mount the power board within the inverter. The plate may be further configured to support the control board such that a number of components and/or mounting elements within the inverter may be reduced. In this way, a cost and packaging size of the inverter may be further reduced.

Figure 2:
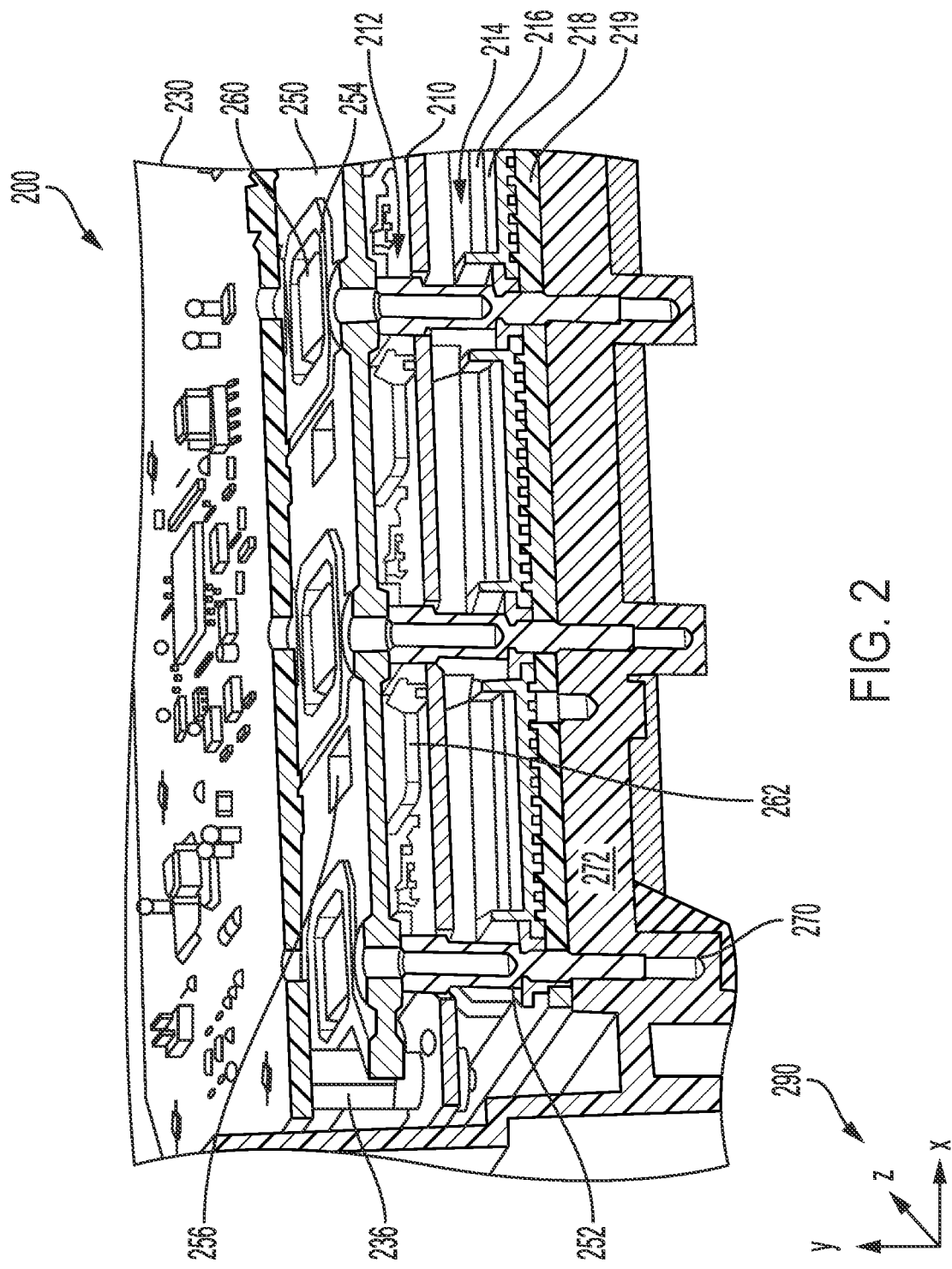
FIG. 2 is an embodiment of a control board of an inverter, according to an embodiment of the present disclosure.
Figure 3B:
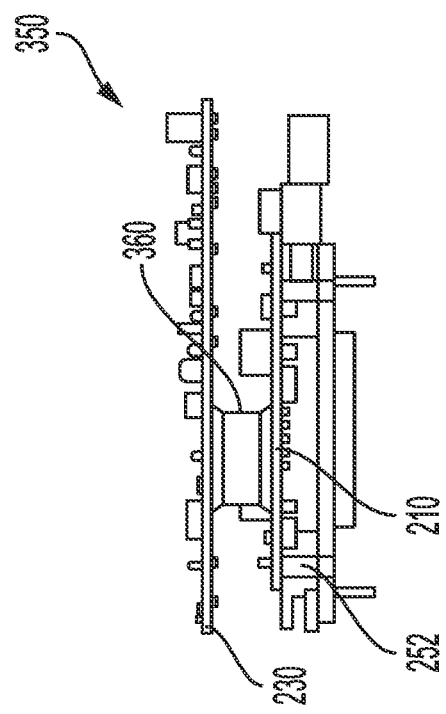
FIGS. 3A and 3B show an embodiment of the circuit plates of the inverter, according to embodiments of the present disclosure.
Figure 3A:
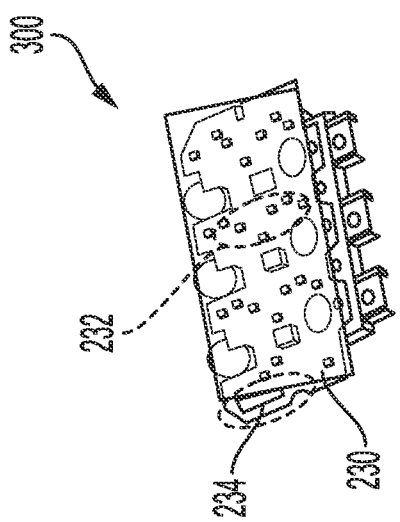

FIGS. 1-3B show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example. It will be appreciated that one or more components referred to as being "substantially similar and/or identical" differ from one another according to manufacturing tolerances (e.g., within 1-5% deviation). FIGS. 2-3B are shown approximately to scale, however, other dimensions may be used if desired.

Turning now to FIG. 1, a vehicle 100 is shown comprising a powertrain 101 and a drivetrain 103. The powertrain comprises a prime mover 106 and a transmission 108. The prime mover 106 may be an internal combustion engine or an electric motor, for example, and is operated to provide rotary power to the transmission 108. The transmission 108 may be any type of transmission, such as a manual transmission, an automatic transmission, or a continuously variable transmission. The transmission 108 receives the rotary power produced by the prime mover 106 as an input and outputs rotary power to the drivetrain 103 in accordance with a selected gear or setting.

The prime mover 106 may be powered via energy from an energy storage device 105. In one example, the energy storage device 105 is a battery configured to store electrical energy. An inverter 107 may be arranged between the energy storage device 105 and the prime mover 106 and configured to adjust direct current (DC) to alternating current (AC). The inverter 107 may include a variety of components and circuitry with thermal demands that affect an efficiency of the inverter. As will be described herein, the inverter 107 may include a cooling arrangement configured to meet the thermal demands of the components of the inverter 107 while decreasing a packaging size thereof. The cooling arrangement of the inverter 107 is described in greater detail with respect to FIGS. 2-3B herein.

The vehicle 100 may be one or more of a commercial vehicle, light, medium, or heavy duty vehicle, a passenger vehicle, an off-highway vehicle, and sport utility vehicle. Additionally or alternatively, the vehicle 100 and/or one or more of its components may be in industrial, locomotive, military, agricultural, and aerospace applications. In one example, the vehicle 100 is an electric vehicle.

In some examples, such as shown in FIG. 1, the drivetrain 103 includes a first axle assembly 102 and a second axle assembly 112. The first axle assembly 102 may be configured to drive a first set of wheels 104, and the second axle assembly 112 may be configured to drive a second set of wheels 114. In one example, the first axle assembly 102 is arranged near a front of the vehicle 100 and thereby comprises a front axle, and the second axle assembly 112 is arranged near a rear of the vehicle 100 and thereby comprises a rear axle. The drivetrain 103 is shown in a four-wheel drive configuration, although other configurations are possible. For example, the drivetrain 103 may include a front-wheel drive, a rear-wheel drive, or an all-wheel drive configuration. Further, the drivetrain 103 may include one or more tandem axle assemblies. As such, the drivetrain 103 may have other configurations without departing from the scope of this disclosure, and the configuration shown in FIG. 1 is provided for illustration, not limitation. Further, the vehicle 100 may include additional wheels that are not coupled to the drivetrain 103.

In some four-wheel drive configurations, such as shown in FIG. 1, the drivetrain 103 includes a transfer case 110 configured to receive rotary power output by the transmission 108. A first driveshaft 113 is drivingly coupled to a first output 111 of the transfer case 110, while a second driveshaft 122 is drivingly coupled to a second output 121 of the transfer case 110. The first driveshaft 113 (e.g., a front driveshaft) transmits rotary power from the transfer case 110 to a first differential 116 of the first axle assembly 102 to drive the first set of wheels 104, while the second driveshaft 122 (e.g., a rear driveshaft) transmits the rotary power from the transfer case 110 to a second differential 126 of the second axle assembly 112 to drive the second set of wheels 114. For example, the first differential 116 is drivingly coupled to a first set of axle shafts 118 coupled to the first set of wheels 104, and the second differential 126 is drivingly coupled to a second set of axle shafts 128 coupled to the second set of wheels 114. It may be appreciated that each of the first set of axle shafts 118 and the second set of axle shafts 128 may be positioned in a housing.

In some examples, additionally or alternatively, the vehicle 100 may be a hybrid vehicle including both an engine an electric machine each configured to supply power to one or more of the first axle assembly 102 and the second axle assembly 112. For example, one or both of the first axle assembly 102 and the second axle assembly 112 may be driven via power originating from the engine in a first operating mode where the electric machine is not operated to provide power (e.g., an engine-only mode), via power originating from the electric machine in a second operating mode where the engine is not operated to provide power (e.g., an electric-only mode), and via power originating from both the engine and the electric machine in a third operating mode (e.g., an electric assist mode). As another example, one or both of the first axle assembly 102 and the second axle assembly 112 may be an electric axle assembly configured to be driven by an integrated electric machine.

Turning now to FIG. 2, it shows an embodiment of a semi-conductor assembly 200 of an inverter (e.g., inverter 107 of FIG. 1). The semi-conductor assembly 200 may include a power board 210 and a control board 230. An axis system 290 is shown including three axes, namely an x-axis parallel to a horizontal direction, a y-axis parallel to a vertical direction, and a z-axis normal to each of the x- and y-axes. In one example, the y-axis is parallel to a direction of gravity.

The power board 210 may be a first printed circuit board assembly (PCBA) of the semi-conductor assembly 200. In one example, the power board 210 is a gate board driver comprising a plurality of gate resistors 212. The power board 210 may further include a power module 214 comprising one or more electrodes 216 and insulation 218. The power module 214 and the plurality of gate resistors 212 may generate waste heat, which may heat surrounding components, such as the control board 230. In one example, the power module 214 is a silicon carbide module with fine pin modules in an engagement with a plurality of cooling pins 219.

The control board 230 may include a controller (e.g., a central processing unit (CPU)). In one example, the control board 230 is a second PCBA, separate from the power board 210. The control board 230 may include power module control pins 232 as shown in the face-on view of FIG. 3A. In one example, the power module control pins 232 are press fit near a central region of the control board 230. The control board 230 may further include connector 234. The connector 234, in combination with a connector extension 236 shown in FIG. 2, may couple the control board 230 to the power board 210. As such, signals from the control board 230 may be sent through the connector 234 to the power board 210.

Returning to FIG. 2, a plate 250 may be arranged between the power board 210 and the control board 230. More specifically, the plate 250 may be arranged above the power board 210 and below the control board 230. The plate 250 may be a metal plate comprising steel, stainless steel, aluminum, ceramic, magnesium, carbon fiber, or a combination thereof. In one example, the plate 250 is aluminum.

The plate 250 may be configured to support and cool the control board 230. The plate 250 may be mounted in contact with a coolant jacket 270 arranged in a base 272 of the inverter. A plurality of pins 252 of the plate 250 may extend into the coolant jacket 270 and be in direct contact with coolant therein. The coolant may actively cool the plurality of pins 252, which may cool the plate 250. The plurality of pins 252 and the plate 250 may be a single piece. Thus, the plurality of pins 252 may include aluminum.

The plurality of cooling pins 219 may be coupled to the power module 214 and the base 272. In one example, the plurality of cooling pins 219 are arranged between the base 272 and the power module 214 and at least partially submerged in coolant.

In one example, each of the plurality of pins 252 may be adjacent to a gate resistor of the plurality of gate resistors 212. In some embodiments, each of the plurality of pins 252 is in direct contact with a gate resistor of the plurality of gate resistors 212, which may provide active cooling of the gate resistor. Heat generated by the plurality of gate resistors may be blocked by the plate 250 from reaching the control board 230.

The plurality of pins 252 may be semi-hollow. The hollow sections of the plurality of pins 252 may be configured to receive a fastener or other coupling device. The fastener may extend through the control board 230, through the plate 250, and past the power board 210 to a section of the plurality of pins 252 adjacent to the base 272.

The plate 250 may include two longitudinal sides parallel to one another and the x-axis and two lateral sides parallel to one another and the y-axis. The lateral side adjacent to the connector extension 236 may be indented. More specifically, the plate 250 may include angled walls that extend toward a center of the plate 250, within a x-z plane of the plate 250, and indent the lateral side to prevent contact between the plate 250 and the connector extension 236. In one example, the plate 250 and the lateral side nearest the connector extension 236 may include a half-hexagon shape.

The plate 250 may further include a first plurality of openings 254 adjacent to each of the plurality of pins 252. The first plurality of openings 254 may allow tops 260 of a transformer to extend therethrough. The tops 260 may extend to an underside of the control board 230.

A plurality of thermal pads 262 are coupled to an upper surface of the power board 210. The plurality of thermal pads 262 may increase a thermal separation between the power board 210 and the control board 230. In one example, the plurality of thermal pads 262 are physically coupled to the upper surface of the power board 210.

The plate 250 may further include embossments 256. The embossments 256 may be configured to allow the plate 250 to contact the plurality of thermal pads 262 of the power board 210 adjacent to a location of the plurality of gate resistors 212.

In one example, the embodiment of FIG. 2 may allow a space between the power board 210 and the control board 230 to be reduced. A combination of the plate 250 and the thermal pads 260 may enhance cooling of the gate resistors 212 of the power board 210, which may mitigate waste heat transfer to the control board 230. This configuration may allow a size of the inverter to be reduced while maintaining a desired efficiency of the inverter. In some embodiments, additionally or alternatively, a non-conductive dielectric liquid, such as oil, may fill the inverter. The liquid may further reduce heat transfer between the power board 210 and the control board 230, which may allow a space between the power board 210 and the control board 230 to be further reduced.

Turning now to FIG. 3B, it shows a side-on view 350 of the power board 210 and the control board 230. A thermal pad 360 of the plurality of thermal pads 260 of FIG. 2 extends from a top of a gate resistor 312 of the plurality of gate resistors 212 of FIG. 2 to the underside of the control board 230.

The disclosure provides support for a system including an inverter comprising a plate arranged between a power board and a control board, wherein the plate comprises a plurality of tabs for mounting the plate and the power board to a base. A first example of the system further includes where the base comprises a coolant jacket into which the plurality of tabs extends. A second example of the system, optionally including the first example, further includes where the power board comprises a plurality of gate resistors. A third example of the system, optionally including one or more of the previous examples, further includes where each of the plurality of gate resistors is coupled to a thermal pad. A fourth example of the system, optionally including one or more of the previous examples, further includes where the thermal pad extends from the power board to the control board. A fifth example of the system, optionally including one or more of the previous examples, further includes where the control board is coupled to the power board via a connector, wherein the connector extends outside a profile of the plate. A sixth example of the system, optionally including one or more of the previous examples, further includes where the plate is above the power board and below the control board.

The disclosure further provides support for an inverter including a control board above a power board and a plate arranged between the control board and the power board, wherein the plate is configured to directly cool the power board. A first example of the inverter further includes where the plate comprises metal. A second example of the inverter, optionally including the first example, further includes where the plate comprises a plurality of tabs extending into a coolant jacket. A third example of the inverter, optionally including one or more of the previous examples, further includes where the plurality of tabs extends through the power board and mount the power board to the inverter. A fourth example of the inverter, optionally including one or more of the previous examples, further includes where the plurality of tabs is adjacent to gate resistors of the power board. A fifth example of the inverter, optionally including one or more of the previous examples, further includes where the plate is spaced away from a top side of the power board and an underside of the control board. A sixth example of the inverter, optionally including one or more of the previous examples, further includes where the plate is configured to support the control board. A seventh example of the inverter, optionally including one or more of the previous examples, further includes where the plate comprises aluminum, and wherein the control board and the power board are printed circuit boards.

The disclosure provides additional support for a system for an inverter including a control board above a power board and a plate arranged between the control board and the power board, wherein the plate is configured to mount the power board to a base comprising a cooling jacket, wherein the plate comprises a plurality of tabs that extend into the cooling jacket. A first example of the system further includes where the plate comprises a plurality of openings through which thermal pads extend. A second example of the system, optionally including the first example, further includes where the thermal pads extend from gate resistors of the power board to an underside of the control board. A third example of the system, optionally including one or more of the previous examples, further includes where the plate comprises an indentation along a lateral edge, and wherein a connector for transmitting signals from the control board to the power board extends adjacent to the indentation. A fourth example of the system, optionally including one or more of the previous examples, further includes where the plate is actively cooled via coolant contacting the plurality of tabs.

As used herein, the term "approximately" is construed to mean plus or minus five percent of the range unless otherwise specified.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The inventioin claimed is:

1. A system, comprising: an inverter comprising a plate arranged between a power board and a control board, wherein the plate comprises a plurality of tabs for mounting the plate and the power board to a base; wherein the base comprises a coolant jacket into which the plurality of tabs extends.

2. The system of claim 1, wherein the power board comprises a plurality of gate resistors.

3. The system of claim 2, wherein each of the plurality of gate resistors is coupled to a thermal pad.

4. The system of claim 3, wherein the thermal pad extends from the power board to the control board.

5. The system of claim 1, wherein the control board is coupled to the power board via a connector, wherein the connector extends outside a profile of the plate.

6. The system of claim 1, wherein the plate is above the power board and below the control board.

7. An inverter, comprising: a control board above a power board; and a plate arranged between the control board and the power board, wherein the plate is configured to directly cool the power board; wherein the plate comprises a plurality of tabs extending into a coolant jacket.

8. The inverter of claim 7, wherein the plate comprises metal.

9. The inverter of claim 7, wherein the plurality of tabs extends through the power board and mount the power board to the inverter.

10. The inverter of claim 7, wherein the plurality of tabs is adjacent to gate resistors of the power board.

11. The inverter of claim 7, wherein the plate is spaced away from a top side of the power board and an underside of the control board.

12. The inverter of claim 7, wherein the plate is configured to support the control board.

13. The inverter of claim 7, wherein the plate comprises aluminum, and wherein the control board and the power board are printed circuit boards.

14. A system for an inverter, comprising:
a control board above a power board; and
a plate arranged between the control board and the power board, wherein the plate is configured to mount the power board to a base comprising a cooling jacket, wherein the plate comprises a plurality of tabs that extend into the cooling jacket.

15. The system of claim 14, wherein the plate comprises a plurality of openings through which thermal pads extend.

16. The system of claim 15, wherein the thermal pads extend from gate resistors of the power board to an underside of the control board.

17. The system of claim 14, wherein the plate comprises an indentation along a lateral edge, and wherein a connector for transmitting signals from the control board to the power board extends adjacent to the indentation.

18. The system of claim 14, wherein the plate is actively cooled via coolant contacting the plurality of tabs.

* * * * *